United States Patent
Kuo

(10) Patent No.: US 10,672,639 B2
(45) Date of Patent: Jun. 2, 2020

(54) METHOD FOR AUTOMATIC SENDING CASSETTE POD

(71) Applicant: Taiwan Semiconductor Manufacturing Co., Ltd., Hsinchu (TW)

(72) Inventor: Tsung-Sheng Kuo, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/599,798

(22) Filed: May 19, 2017

(65) Prior Publication Data

US 2018/0158708 A1 Jun. 7, 2018

Related U.S. Application Data

(60) Provisional application No. 62/430,966, filed on Dec. 7, 2016.

(51) Int. Cl.
*H01L 21/677* (2006.01)
*B66C 1/62* (2006.01)

(52) U.S. Cl.
CPC ......... *H01L 21/67733* (2013.01); *B66C 1/62* (2013.01); *H01L 21/67736* (2013.01); *H01L 21/67772* (2013.01); *H01L 21/67775* (2013.01); *B65G 2201/0297* (2013.01)

(58) Field of Classification Search
CPC ......... H01L 21/67772; H01L 21/67775; H01L 21/68; H01L 21/6835; H01L 21/6773; H01L 21/67736
See application file for complete search history.

(56) References Cited

U.S. PATENT DOCUMENTS

| | | | |
|---|---|---|---|
| 9,543,180 B2* | 1/2017 | Kamiya | H01L 21/67775 |
| 9,857,124 B2* | 1/2018 | Obara | F16B 2/02 |
| 2002/0124960 A1* | 9/2002 | Nakashima | C23C 16/54 |
| | | | 156/345.31 |
| 2003/0059284 A1* | 3/2003 | Inui | B65G 1/0485 |
| | | | 414/331.02 |
| 2016/0035607 A1* | 2/2016 | Lee | H01L 21/67294 |
| | | | 414/304 |
| 2016/0273836 A1* | 9/2016 | Obara | F27B 17/0016 |
| 2016/0336209 A1* | 11/2016 | Yoshioka | B65G 35/00 |

FOREIGN PATENT DOCUMENTS

JP 2016216137 A * 12/2016 ............. B65G 35/00

* cited by examiner

*Primary Examiner* — Gerald McClain
(74) *Attorney, Agent, or Firm* — McClure, Qualey & Rodack, LLP

(57) ABSTRACT

A system for sending a cassette pod is provided. The system includes a processing machine having a load port for receiving the cassette pod. The system further includes a manipulating apparatus positioned above the processing machine. The manipulating apparatus includes an intermediate module having a stage and a driving mechanism connected to the stage to change the position of the stage. The manipulating apparatus further includes a conveyor module having a gripper assembly for grasping the cassette pod.

20 Claims, 16 Drawing Sheets

METHOD FOR AUTOMATIC SENDING CASSETTE POD

PRIORITY CLAIM AND CROSS-REFERENCE

This application claims the benefit of U.S. Provisional Application No. 62/430,966, filed on Dec. 7, 2016, the entirety of which is incorporated by reference herein.

BACKGROUND

In the manufacturing of an integrated circuit (IC) product, the IC product is usually processed at many work stations or by many processing apparatuses. Transporting partially finished products is therefore conducted during the manufacturing process.

For example, to package an IC product, various steps of deposition, cleaning, ion implantation, etching and passivation may be carried out before the semiconductor substrates are packaged for shipment. Each of these fabrication steps may be performed in different processing machines. Therefore, the substrates that are partially processed are transported between various work stations many times before the fabrication process is complete.

In some systems, cassette pods are used to store batches of substrates. To transport the substrates, the substrates are moved into the cassette pods, and the cassette pods and the semiconductor substrates are transported together by handling and transport equipment. Operation of the handling and transport equipment may be conducted under automatic control using a programmed computer which issues control signals for operating the equipment with little or no intervention by an operator. Therefore the handling and transport equipment transports the cassette pods and the substrates between two positions for different purposes.

Although existing methods and devices for sending cassette pods have generally been adequate for their intended purposes, they have not been entirely satisfactory in all respects. Consequently, it is desirable to provide a solution for the process control for semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
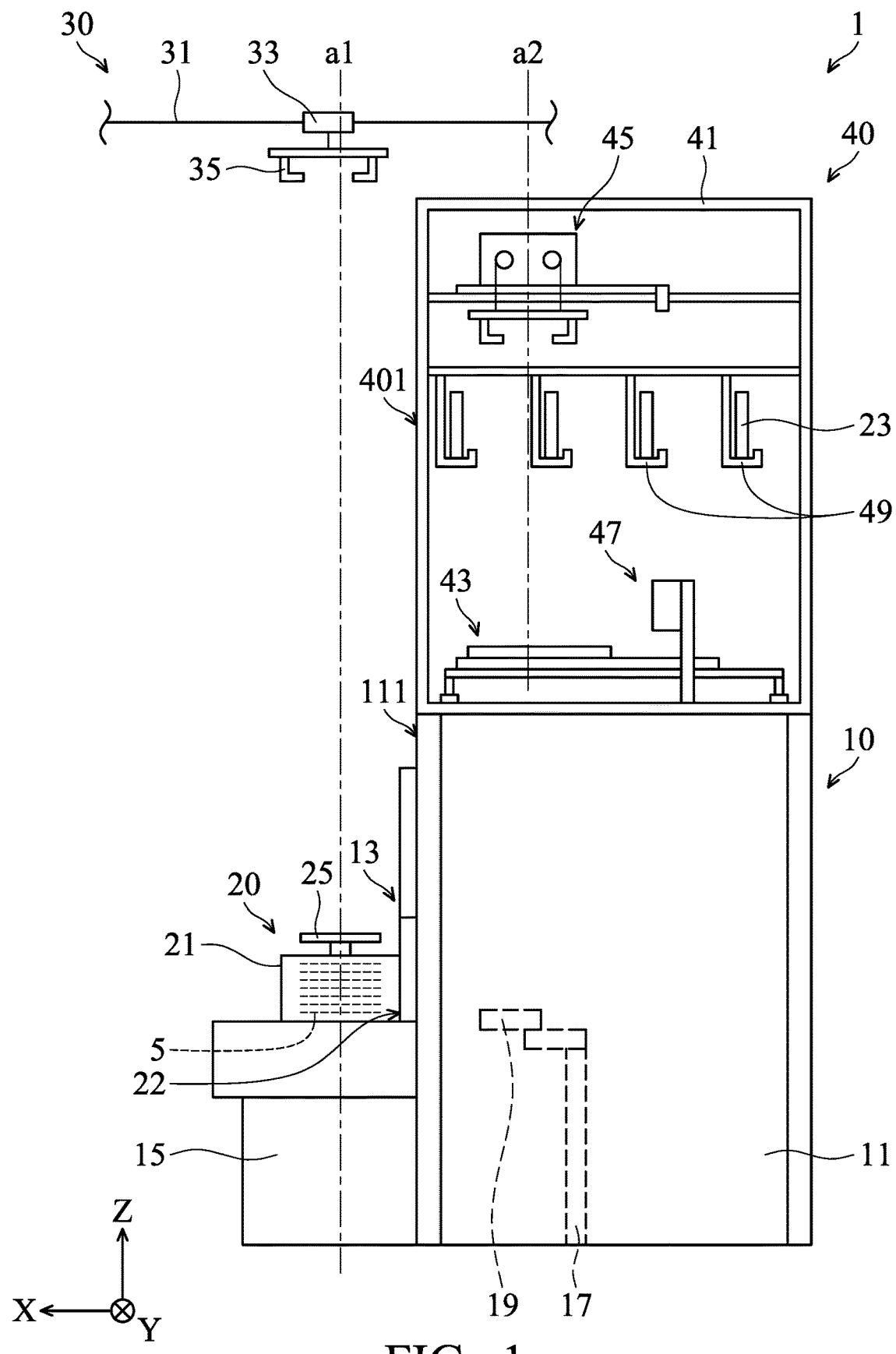
FIG. 1 is a schematic view of a system for processing an integrated circuit (IC) product, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 shows a schematic view of a system 1 for sending a cassette pod 20 in a fabrication facility (FAB), in accordance with some embodiments. In some embodiments, the system 1 includes a processing machine 10, a transportation apparatus 30 and a manipulating apparatus 40. The elements of the system 1 can be added to or omitted, and the invention should not be limited by the embodiment.

The processing machine 10 is provided in a FAB which can be supported from the floor(s) of the FAB. The processing machine 10 can be any type of substrate processing, metrology, inspection, testing, or other tool typically used in semiconductor product processing and production.

In some embodiments, the substrate 5 includes a number of semiconductor devices bonded to a carrier substrate by using resulting chip-on-wafer-on-substrate (CoWoS) technique. The carrier substrate may be any suitable package substrate, such as a printed circuit board (PCB), an organic substrate, a ceramic substrate, a motherboard, or the like. The carrier substrate may be used to interconnect CoW package with other packages/devices to form functional circuits.

The semiconductor device formed on the carrier substrate may be a die or a package. The semiconductor device may include digital SiP's, radio frequency (RF) SiP's, sensor SiP's, mixed signal SiP's, integrated circuits, drivers, electrostatic discharge (ESD) and/or electromagnetic interference (EMI) protection circuits, direct current (DC)/DC converters, SiP's with chip embedded technology, discrete passive devices, Bluetooth™ modules, television (TV) modules, amplitude and/or frequency modulation (AM and/or FM) modules, global positioning system (GPS) modules, baseband modules, camera modules, cellular radio modules, audio modules, power management modules, central processing unit (CPU) modules, wireless local area network (WLAN) modules, integrated passive device (IPD) modules, IPD network modules, light emitting diode (LED) flash modules, graphics processing unit (GPU) modules, and/or visual processing unit (VPU) modules, as examples. Alternatively, the semiconductor devices may include other types of functions, circuitry, and packages.

In some other embodiments, the substrate 5 may be made of silicon or other semiconductor materials. Alternatively or additionally, the wafer 5 may include other elementary semiconductor materials such as germanium (Ge). In some embodiments, the wafer 5 is made of a compound semiconductor such as silicon carbide (SiC), gallium arsenic (GaAs), indium arsenide (InAs), or indium phosphide (InP). In some embodiments, the wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the wafer 5 includes an epitaxial layer. For example, the wafer 5 has an epitaxial layer overlying a bulk semiconductor. In some other embodiments, the wafer 5 may be a silicon-on-insulator (SOI) or a germanium-on-insulator (GOI) substrate.

In addition, the substrate 5 may have various device elements. Examples of device elements that are formed in the wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the processing machine 10 includes a processing tool 11 and one or more load ports 15 operable for supporting and docking the cassette pod 20 to facilitate insertion and removal of substrates 5 into and from the processing tool 11. In some embodiments, there are multiple load ports 15 facilitate substrate loading and unloading into and from the processing tool 11 to expedite cassette pod 20 switchover between the manipulating apparatus 40 and the processing machine 10 for minimizing Q time. In some possible embodiments, for example without limitation, three load ports 15 are provided as shown for flexibility in staging cassette pod 20.

In some embodiments, the processing machine 10 further includes a tool access door 13 through which substrates 5 are loaded into and unloaded from the processing tool 11. The tool access doors 13 are configured for docking with the cassette pod 20 and in some embodiments include appropriate elastomeric or rubber seals for forming a seal with the substrate carriers to minimize exposure of the substrates 5 to the FAB ambient atmosphere. In some embodiments, the tool access door 13 have a generally rectangular or square shape to complement the configuration of the cassette pod 20 access door.

In some embodiments, the processing machine 10 also includes a feed mechanism 17. The feed mechanism 17 is operable to selectively retrieve or load a substrate 5 from/ into the cassette pod 20 through a respective tool access door 13 at the load ports 15. The feed mechanism 17 includes an automated articulating robotic arm 19 terminating in a gripper configured and operable for multi-directional movement and to grasp or release a substrate 5. The robotic arm 19 is motor-driven and operated via a computer or microprocessor based control system (not shown) associated with each processing tool 11 that is programmable with software for controlling the movements of the robotic arm 19.

The robotic arm 19 has any suitably shaped substrate gripper including a bifurcated U-shaped or V-shaped gripper, straight gripper, or any other configuration so long as the gripper is operable to securely grip and hold a substrate 5 with appropriate gripping force.

For example, since substrates 5 are oriented horizontally, but stacked vertically in slots in the cassette pod 20, the robotic arms 19 are capable of straight line motion in a horizontal plane to retrieve and insert substrates from/into the cassette pod 20. The robotic arms 19 are typically further capable of at least some degree of vertical movement up and down the stacked substrates to select substrates from various storage slots or levels in the cassette pod 20. In some embodiments, the robotic arms 19 are further capable of combination or "gross" motion consisting of angular and liner motion to transport substrates between different approach positions to the processing tool 11 and within the processing tool 11.

The cassette pod 20 may be any type of substrate carrier such as a SMIF pod. Each cassette pod 20 holds a plurality of substrates 5. For example, some embodiments of the cassette pod 20 are configured to hold approximately 24 substrates 5. The cassette pod 20 may include various appurtenances including without limitation a main body 21, an operable/closeable and sealable door 23, and a hook or flange 25. The main body 21 is configured for containing the substrate 5. A number of horizontal internal slots (not shown) are positioned in the main body 21 for holding the substrates 5 in position. The main body 21 has an opening 22 adapted for receiving a door so as to maintain the substrates 5 in a controlled environment during transport isolated from the ambient FAB conditions to prevent contamination (In the embodiments shown in FIG. 1, the door 23 is detached from the main body 21 and stored in the storage rack 49). The hook or flange 25 is configured to be grasped by a gripper assembly 35 of an OHT vehicle 33. The cassette pod 20 may further include coupling mechanisms (not shown) for docking to the load port 15 of the processing machine 10 or stocker.

The transporting apparatus 30 is configured to transport or convey the cassette pods 20 to and from the stocker and/or the manipulating apparatus 40. The transporting apparatus 30 includes a rail 31, an overhead hoist transport (OHT) vehicle 33, and a transporting controller (not shown), in accordance with some embodiments.

In some embodiments, the rail 31 is monorail that is mounted to and suspended from the ceiling and/or walls of the FAB. The rail 31 may have any suitable cross-sectional configuration so long as the OHT vehicle 33 is appropriately supported from the rail for rolling motion. The transportation or the movement of the OHT vehicle 33 on the rail 31 is controlled by the transporting controller (not shown).

The OHT vehicle 33 is configured and structured to hold a cassette pod 20 housing the substrates 5 and transport the cassette pod 20 in a generally horizontal or lateral direction from one location to another within the FAB. For example, the cassette pod 20 is transferred by the OHT vehicle 33 to the manipulating apparatus 40 positioned on the processing apparatus 10 from a stocker (not shown).

In some embodiments, the OHT vehicle 33 includes the gripper assembly 35 and a motor-driven or pneumatic hoisting mechanism P. The hoisting mechanisms P are operable to vertically raise and lower the gripper assembly 35. The gripper assembly 35 may include one or more retractable and extendable gripper arms having a gripper on the end and configured for locking onto the mating hook or flange 25 on the cassette pod 20.

It should be appreciated that while the cassette pod 20 is transported by the OHT vehicle 33, the embodiments of the disclosure should not be limited thereto. The cassette pod 20 can be transported in the FAB by a different mechanism including numerous types of automated and manual vehicles during the manufacturing process. This can include for example automatic guided vehicles (AGVs), personal guided vehicles (PGVs), rail guided vehicles (RGVs), and overhead shuttles (OHSs).

The manipulating apparatus 40 is configured to adjust the position and orientation of the cassette pod 20 so as to allow the cassette pod 20 to be positioned properly for the consecutive process or transportation.

In some embodiments, the manipulating apparatus 40 includes a housing 41, an intermediate module 43, a conveyor module 45, a door handling module 47 and one or more storage racks 49. The elements of the manipulating apparatus 40 can be added to or omitted, and the invention should not be limited by the embodiment.

The housing 41 is configured for receiving elements of the manipulating apparatus 40. In some embodiments, the housing 41 is positioned on the top of the processing tool 11. A number of passages for enabling the intermediate module 43 and the conveyor module 45 to be moved from a second axis a2 (i.e., retrieval position) to a first axis a1 (i.e., stretched-out position) are defined at a lateral surface 401 of the housing 41. The first axis a1 passes through a point on the load port 15 (FIG. 1) where the center of the cassette pod 20 is going to be placed. The lateral surface 401 of the housing 41 is immediately adjacent to the lateral surface 111 of the processing tool 11 where the tool access door 13 is located.

Figure 2:
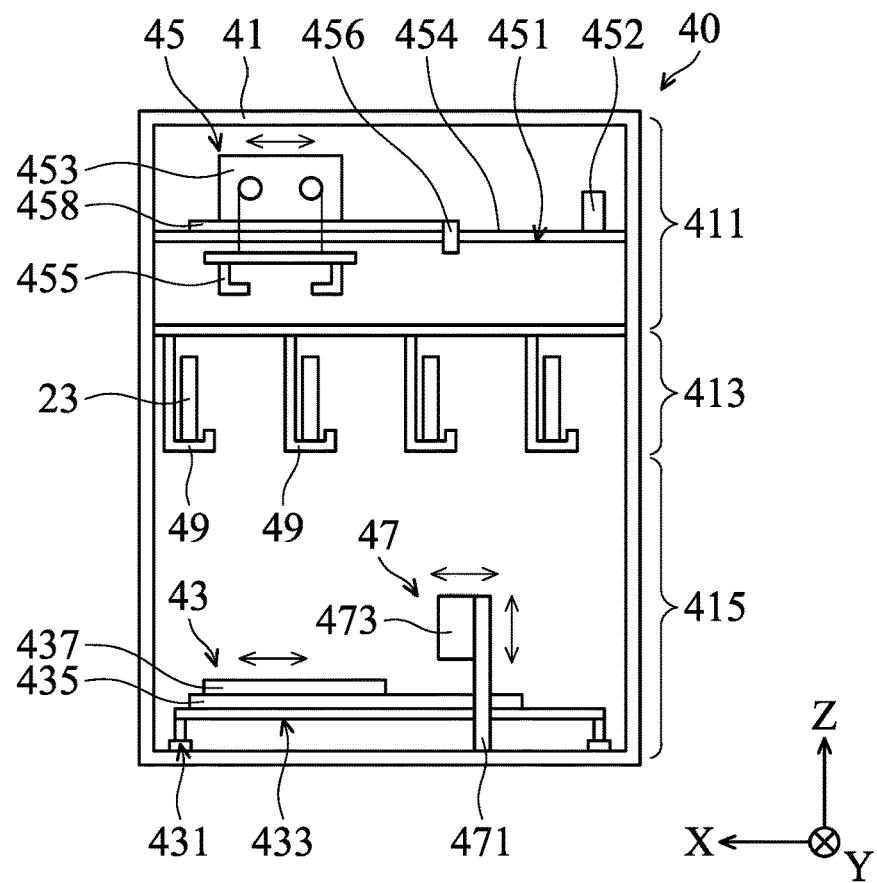
FIG. 2 shows a schematic view of a manipulating apparatus, wherein a conveyor module and an intermediate module are positioned in a retrieval position, in accordance with some embodiments.

FIG. 2 shows a schematic view of the manipulating apparatus 40, in accordance with some embodiments. For the purpose of illustration, as shown in FIG. 2, the housing 41 is divided into three regions, i.e., an upper section 411, a middle section 413 and a lower section 415 consecutively arranged in the second axis a2. And, the lower section 415 is arranged most adjacent to the processing tool 11 (FIG. 1).

The intermediate module 43 is configured to adjust the position and/or the orientation of the cassette pod 20. In some embodiments, the intermediate module 43 is positioned in the lower section 415 of the housing 41. The intermediate module 43 includes one or more first linear actuators 431, one or more second linear actuators 433, a stage 435 and a rotary actuator 437. The first linear actuator 431, the second linear actuator 433, and rotary actuator 437 can be regarded as a driving mechanism.

Figure 3:
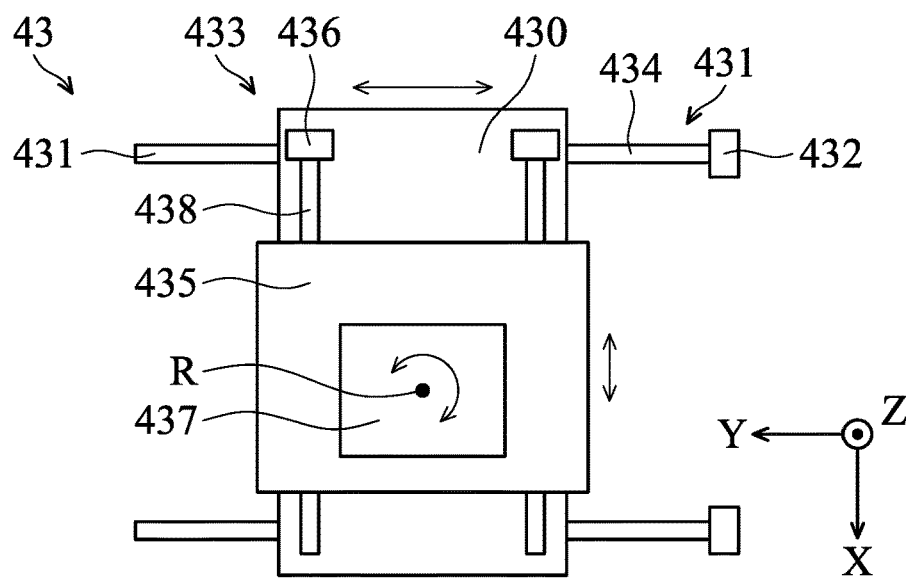
FIG. 3 shows a top view of an intermediate module, in accordance with some embodiments.

FIG. 3 shows a top view of the intermediate module 43, in accordance with some embodiments. The first linear actuator 431 is configured to drive a movement of the stage 435 in the traversal direction (Y-axis). The first linear actuator 431 may include a motor 432 such as DC brush motor, DC brushless motor, stepper motor, or induction motor. The first linear actuator 431 may also include a lead screw 434 connected to the motor 432 and extending along the traversal direction (Y-axis). The lead screw 434 has a continuous helical thread machined on its circumference running along the length.

The first linear actuator 431 may also include a lead nut or ball nut (not shown) with corresponding helical threads. The lead nut or ball nut is prevented from rotating with the lead screw. Therefore, when the lead screw 434 is rotated, the lead nut or ball nut are driven along the threads. The direction of motion of the lead nut or ball nut depends on the direction of rotation of the lead screw 434.

As shown in FIG. 3, the intermediate module 43 may also include a table 430 for supporting the second linear actuator 433 and the stage 435. The table 430 is positioned on the top of the first linear actuator 431. As a result, when the lead screws 434 are rotated, the motion of the lead screw 434 is converted to linear displacement of the table 430 in the traversal direction (Y-axis). In some embodiments, the table 430 is omitted.

The second linear actuator 433 is configured to drive a movement of the stage 435 in the longitudinal direction (X-axis). The second linear actuator 433 may include a motor 436 such as DC brush motor, DC brushless motor, stepper motor, or induction motor. The second linear actuator 433 may also include a lead screw 438 connected to the motor 436 and extending along the longitudinal direction (X-axis). The lead screw 438 has a continuous helical thread machined on its circumference running along the length.

The second linear actuator 433 may also include a lead nut or ball nut (not shown) with corresponding helical threads. The nut is prevented from rotating with the lead screw. Therefore, when the lead screw is rotated, the nut will be driven along the threads. The direction of motion of the nut depends on the direction of rotation of the lead screw.

The stage 435 is positioned on the top of the second linear actuator 433. As a result, when the lead screw 438 is rotated, the motion of the lead screw 438 is converted to linear displacement of the stage 435 in the longitudinal direction (X-axis).

The rotary actuator 437 is configured to drive a rotation of the stage 435 around a rotation axis R. The rotary actuator 437 may positioned one the stage 435 or positioned below the stage 435. The rotary actuator 437 may include a motor (not shown) such as DC brush motor, DC brushless motor, stepper motor, or induction motor. In some embodiments, the rotary actuator 437 is omitted. The orientation of the cassette pod 20 is not adjusted by the intermediate module 43.

In some embodiments, the first linear actuator 431, the second linear actuator 433 and the rotary actuator 437 are operated via a computer or microprocessor based control system (not shown) associated with each processing tool 11 that is programmable with software for controlling the movements of the stage 435.

For example, the computer may be supplied with a computer program loaded in memory. The computer program may include preprogrammed instructions for moving the stage 435 in the traversal direction and the longitudinal direction by a predetermined distance. Alternatively, the computer program may include preprogrammed instructions for rotating the stage by a predetermined angle. Methods for moving the stage 435 will be described in more detail in the embodiments shown in FIGS. 7A-7B and FIGS. 8A-8B.

Referring back to FIG. 2, the conveyor module 45 is configured for delivering the cassette pod 20 between the intermediate module 43 and the load port 15 (FIG. 1). In some embodiments, the conveyor module 45 is positioned at the upper section 411 of the housing 41. In some embodiments, the conveyor module 45 includes a linear actuator 451, a motor-driven or pneumatic hoisting mechanism 453 and a gripper assembly 455.

The linear actuator 451 is configured to drive a movement of the hoisting mechanism 453 in the longitudinal direction (X-axis). The linear actuator 451 may include a motor 452 such as DC brush motor, DC brushless motor, stepper motor, or induction motor. The second linear actuator 452 may also include a lead screw 454 connected to the motor 436 and extending along the longitudinal direction (X-axis). The lead screw 454 has a continuous helical thread machined on its circumference running along the length.

The linear actuator 451 may also include a lead nut or ball nut 456 with corresponding helical threads. The nut 456 is prevented from rotating with the lead screw. Therefore, when the lead screw 454 is rotated, the nut 456 will be driven along the threads. The direction of motion of the nut 456 depends on the direction of rotation of the lead screw 454. The conveyor module 45 may also include a table 458 for supporting the hoisting mechanism 453. The table 458 is positioned on the top of the nut 456. As a result, when the lead screw 454 is rotated, the motion of the lead screw 454 is converted to linear displacement of the table 458 in the longitudinal direction (X-axis).

The hoisting mechanism 453 is positioned on the table 458. The hoisting mechanism 453 is operable to vertically raise and lower the gripper assembly 455. The gripper assembly 455 may include one or more retractable and extendable gripper arms having a gripper on the end thereof configured for locking onto a mating hook or flange 25 on the cassette pod 20 (FIG. 1).

The door handling module 47 is configured to manipulate the door 23 of the cassette pod 20 (FIG. 1). In some embodiments, the door handling module 47 is positioned at the lower section 415 of the housing 41. The door handling module 47 includes a telescoping rod 471 and a working assembly 473. The telescoping rod 471 may be positioned on linear actuator (not shown) to move in the longitudinal direction (X-axis). The door handling assembly 473 is positioned on the end of the rod 471 for moving the door 23 relative to the cassette pod 20.

Figure 4:
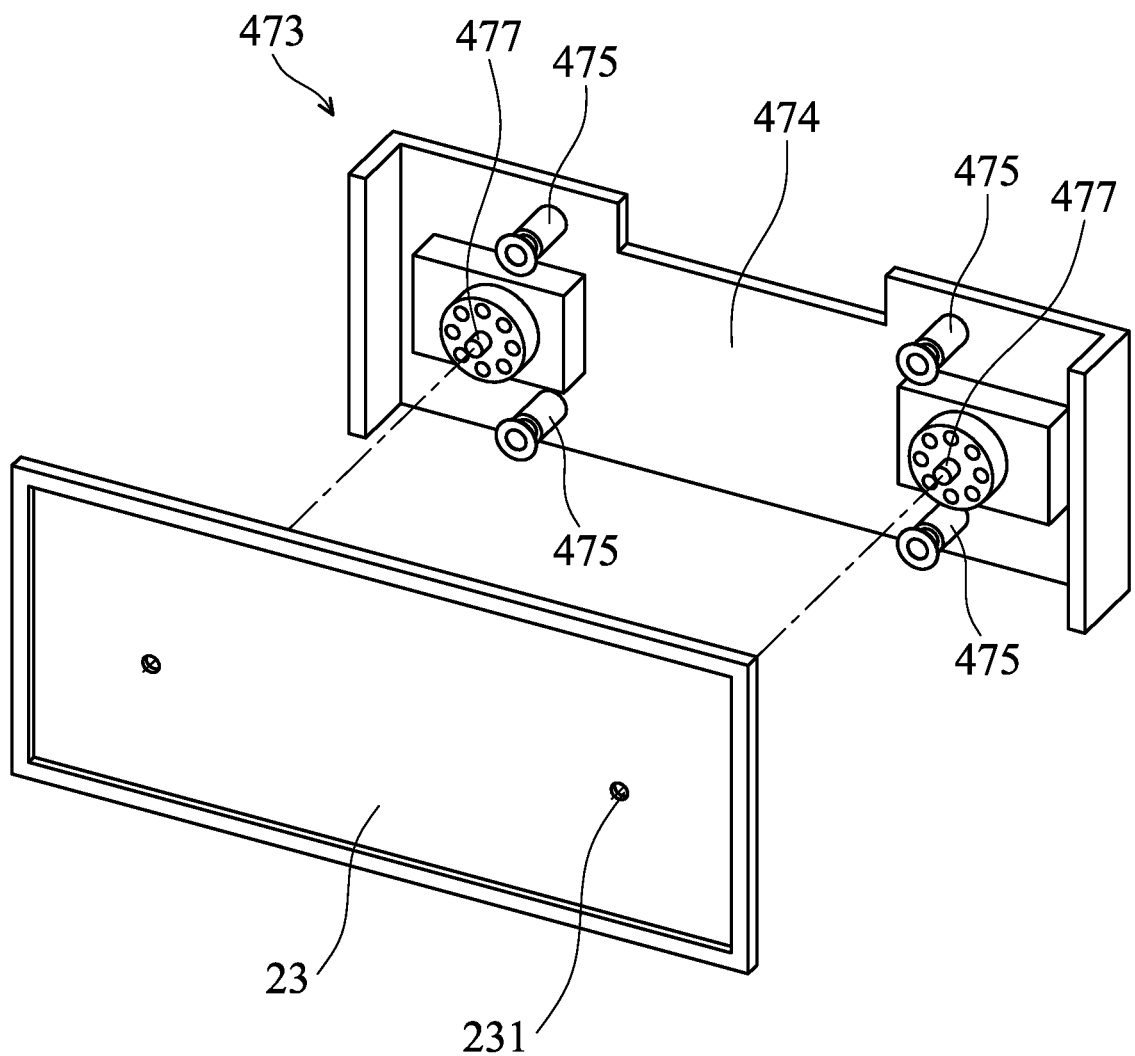
FIG. 4 shows a schematic view of a door handling assembly and a door of a cassette pod, in accordance with some embodiments.

FIG. 4 shows a schematic view of the door handling assembly 473 and the door 23 of the cassette pod 20, in accordance with some embodiments. In some embodiments, the door handling assembly 473 includes a base plate 474, one or more suction members 475 and two insertion members 477. The two insertion members 477 are positioned on the base plate 474 relative to two through holes 231 formed on the door 23. The two insertion members 477 may include pins which can be inserted into the through holes 231 of the door 23.

The suction members 475 are positioned adjacent to the two insertion members 477. In some embodiments, there are two suction members 475 respectively positioned at the upper side and the lower side of each insertion member 477. The suction members 475 may be made of rubber plastic which is formed in a dish-shape. Therefore, when the suction members 475 are in contact with the door 23, the door 23 is fixed on the door handling assembly 473 by the vacuum created between the surface of the door 23 and the suction members 475. As a result, the door 23 can be stably held by the handling assembly 473 during the insertion of the insertion member 477 into the through hole 231.

Referring back to FIG. 2, the storage racks 49 are configured for accommodating the doors 23 of the cassette pod 20 after the door 23 is removed from the cassette pod 20. In some embodiments, the storage racks 49 are positioned at the middle section 413 of the housing 41. However, it should be appreciated that many variations and modifications can be made to embodiments of the disclosure. The storage racks 49 may be positioned in any position in the housing 41 where the door handling module 47 can reach. For example, the storage racks 49 may be positioned next to the intermediate module 43 at the lower section 415 of the housing 41.

Figure 5:
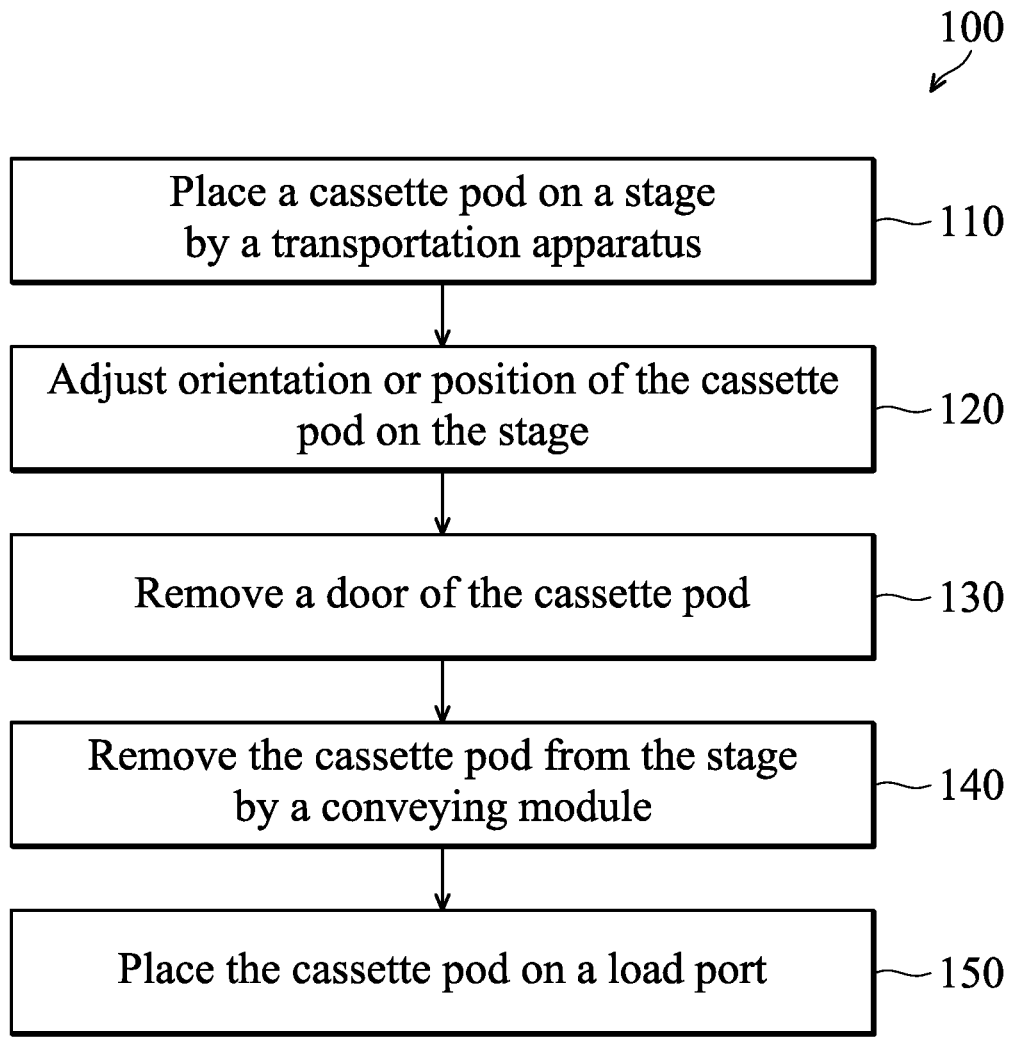
FIG. 5 shows a flow chart illustrating a method for sending a cassette pod from a transportation system to a processing apparatus, in accordance with some embodiments.

FIG. 5 is a flow chart illustrating a method 100 for sending a cassette pod 20 from the transportation apparatus 30 to the load port 15, in accordance with some embodiments. For illustration, the flow chart will be described to accompany the cross-sectional view shown in FIGS. 6-12. Some of the described stages can be replaced or eliminated in different embodiments. Additional features can be added to the semiconductor device structure. Some of the features described below can be replaced or eliminated in different embodiments.

The method 100 begins with operation 110, in which the cassette pod 20 is placed on the intermediate module 43 by the transportation apparatus 30. In some embodiments, the cassette pod 20 with substrates 5 is moved by the OHT vehicle 33 of the transportation apparatus 30. When the OHT vehicle 33 arrives in position over the processing machine 10 (FIG. 1) the gripper assembly 35 of the OHT vehicle 33 is lowered down to place the cassette pod 20 on the stage 435 of the intermediate module 43, as shown in FIG. 6.

Figure 6:
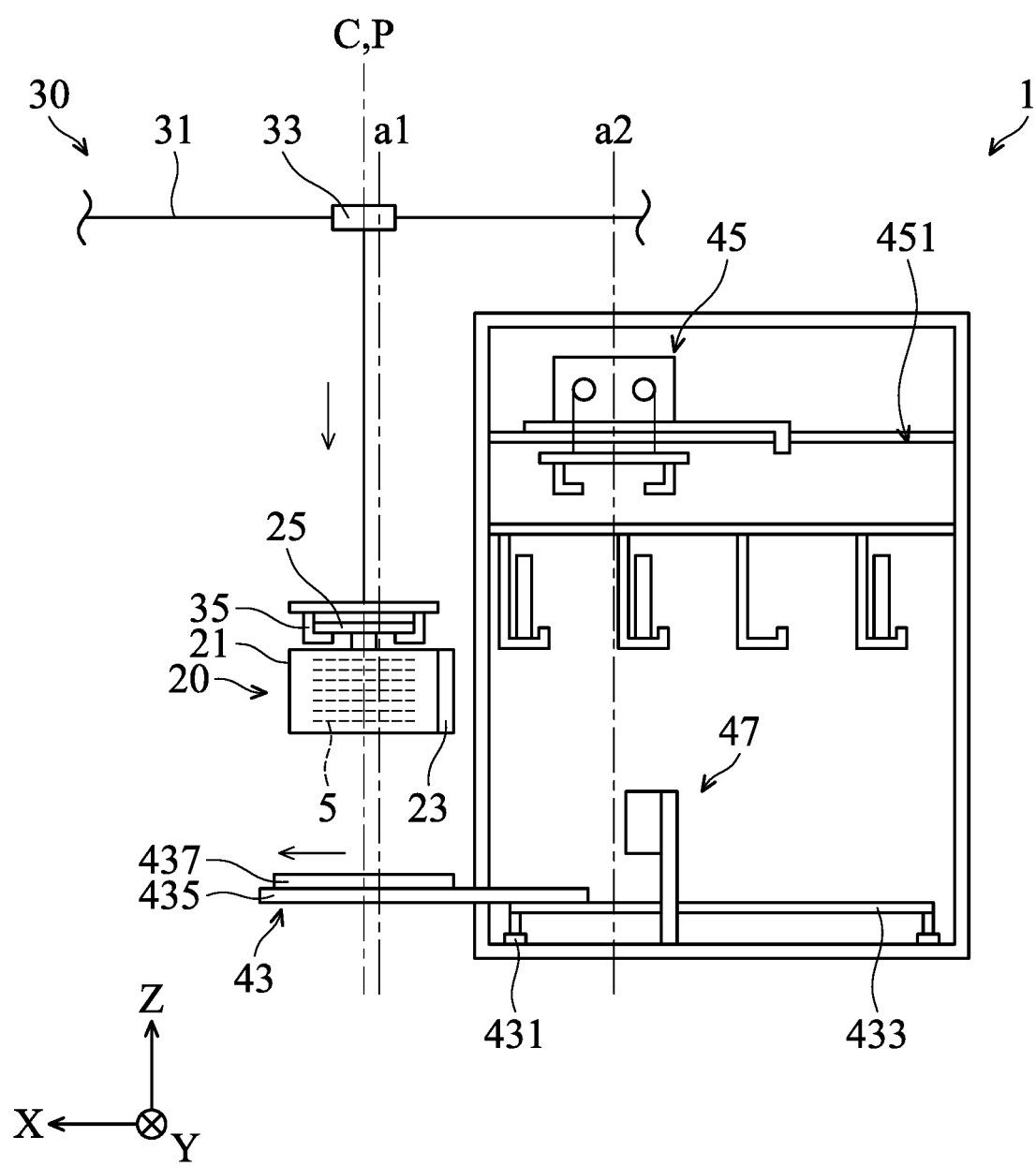
FIG. 6 shows a schematic view of one stage of the method for sending the cassette pod from the transportation system to the processing apparatus before the cassette pod is placed on a stage, in accordance with some embodiments.
Figure 7:
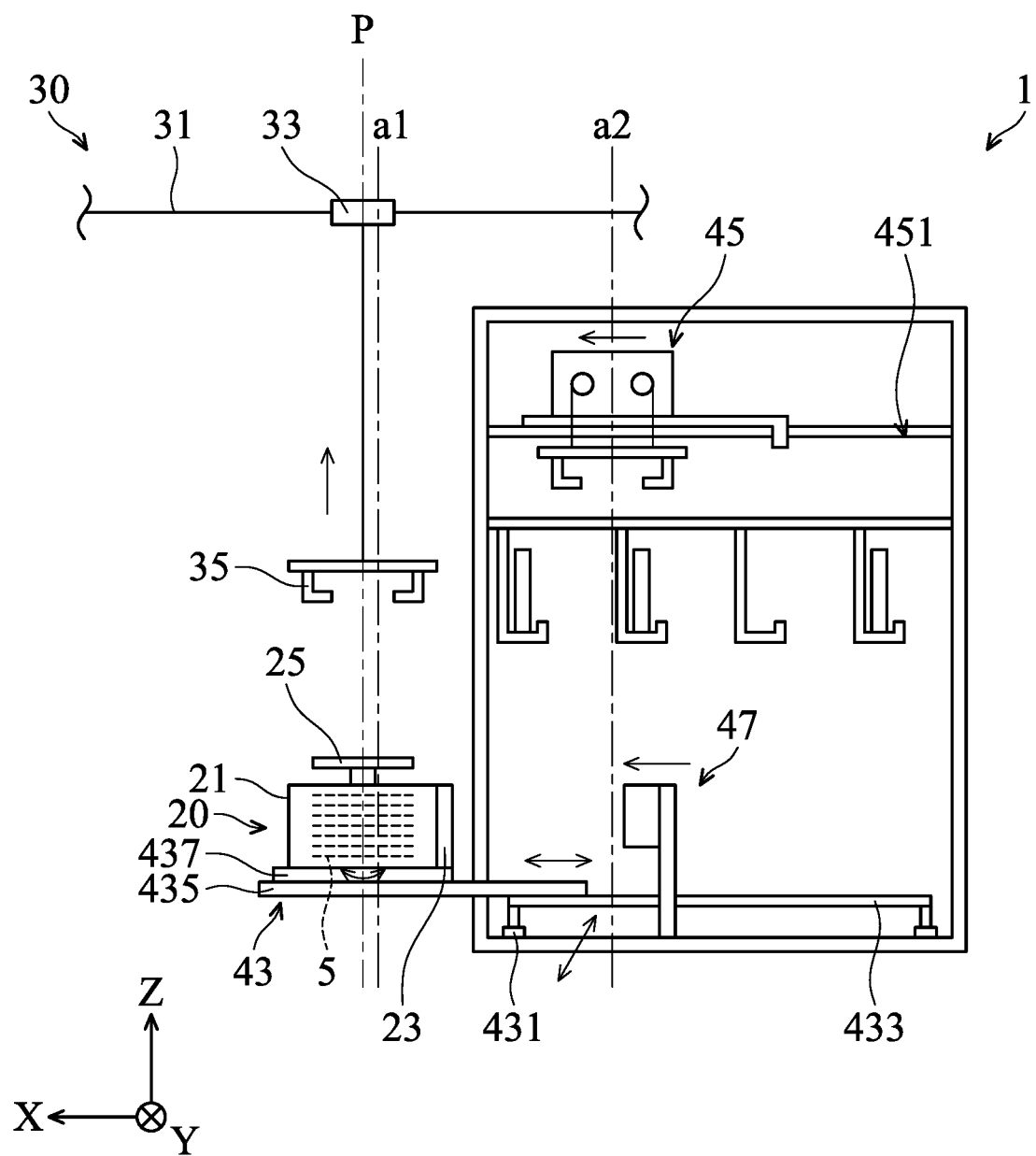
FIG. 7 shows a schematic view of one stage of the method for sending the cassette pod from the transportation system to the processing apparatus as the position and orientation of the cassette pod is adjusted, in accordance with some embodiments.

In some embodiments, before the cassette pod 20 is lowered down, as shown in FIG. 6, the stage 435 is stretched out from the second axis a2 to be positioned below the OHT vehicle 33. In some embodiments, the cassette pod 20 is lowered down along a path P. The center C of the cassette pod 20 may be aligned with the path P (FIG. 6). In order to accept the cassette pod 20, the stage 435 is moved below the cassette pod 20 and is aligned with the path P. Afterwards, as shown in FIG. 7, the cassette pod 20 is released by the gripper assembly 35, and the empty gripper assembly 35 is retracted back to the OHT vehicle 33.

The method 100 continues with operation 120, in which the orientation and/or position of the cassette pod 20 which is placed on the stage 435 of the intermediate module 43 are adjusted.

Figure 8A:
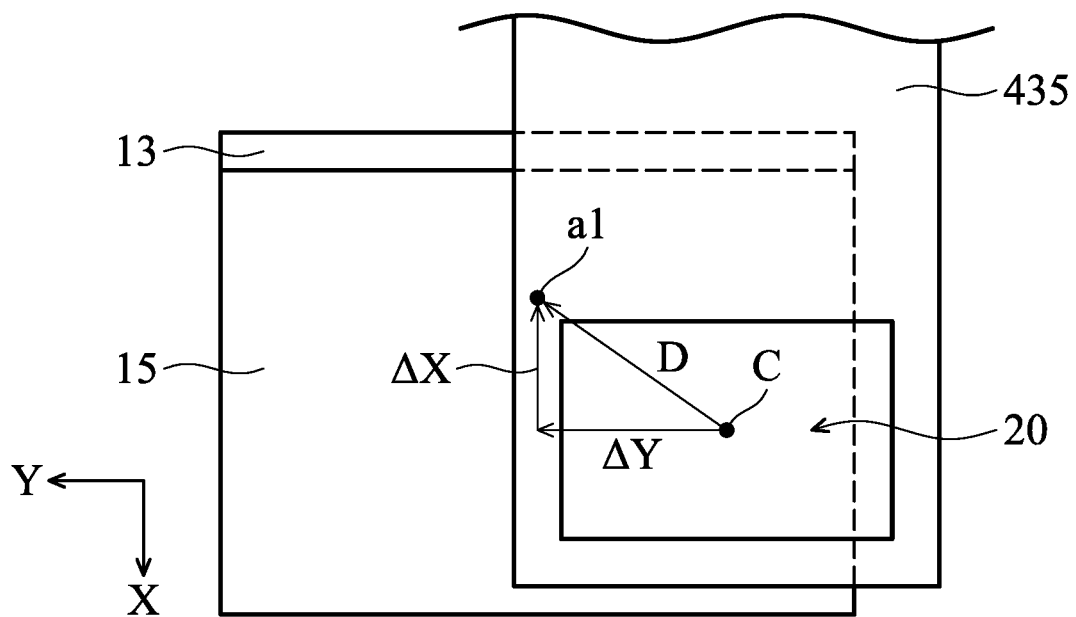
FIGS. 8A and 8B show top views of stages of a method for adjusting a position of the cassette pod, in accordance with some embodiments.

In some embodiments, the position of the cassette pod 20 is adjusted by the first linear actuator 431 and the second linear actuator 433. For example, as shown in FIG. 8A, the center C of the cassette pod 20 is offset from the first axis a1 by a distance of D. In order to align the center C of the cassette pod 20 to the first axis a1, the stage 435 is moved along the longitudinal direction (X-axis) by the first linear actuator 431 and is moved in the traversal direction (Y-axis) by the second linear actuator 433 to move distance D.

Figure 8B:
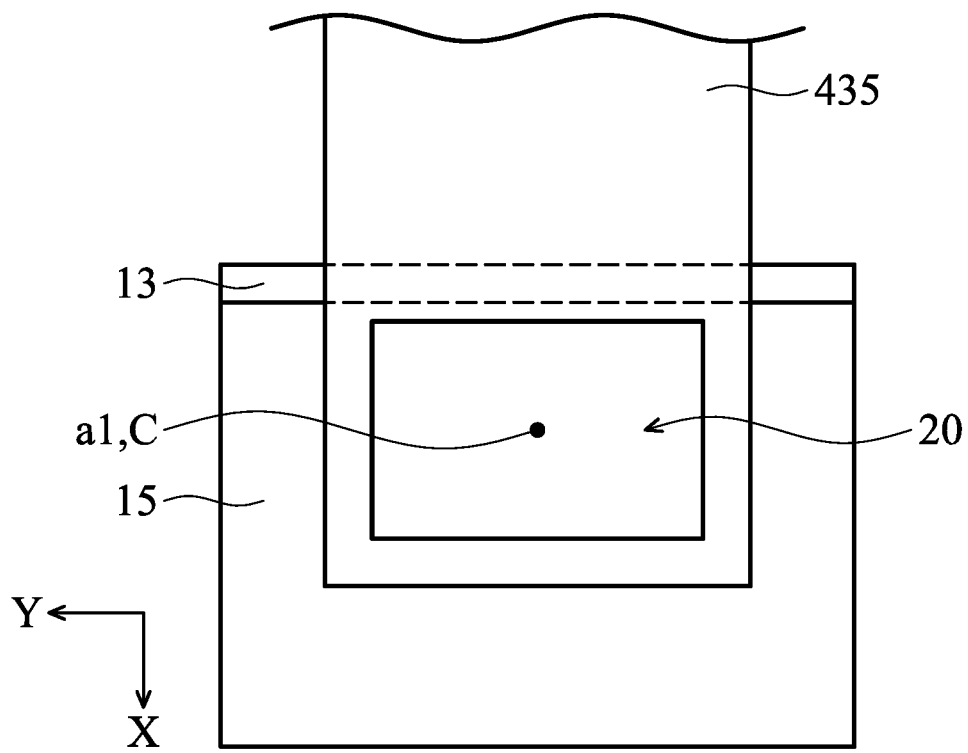

Specifically, the stage 435 is moved by the first linear actuator 431 for a distance ΔY along the traversal direction (Y-axis). In addition, the stage 435 is moved by the second linear actuator 433 for a distance ΔX along the longitudinal direction (X-axis). After adjustment, as shown in FIG. 8B, the center C of the cassette pod 20 is aligned with the first axis a1.

In some embodiments, the offset distance D shown in FIG. 8A is a fixed value after the processing machine 10 is positioned in place of the FAB. Therefore, the adjustment to the position of the cassette pod 20 is performed according to computer program. The computer program is preprogrammed to output a predetermined value of power to the first linear actuator 431 and the second linear actuator 433 corresponding to the desired moving distance.

In some embodiments, the orientation of the cassette pod 20 is adjusted by the rotary actuator 437. The cassette pod 20 is rotated about a rotation axis of the rotary actuator 437 so as to make the opening 22 of the cassette pod 20 face the tool access doors 13 of the processing machine 10.

Figure 9A:
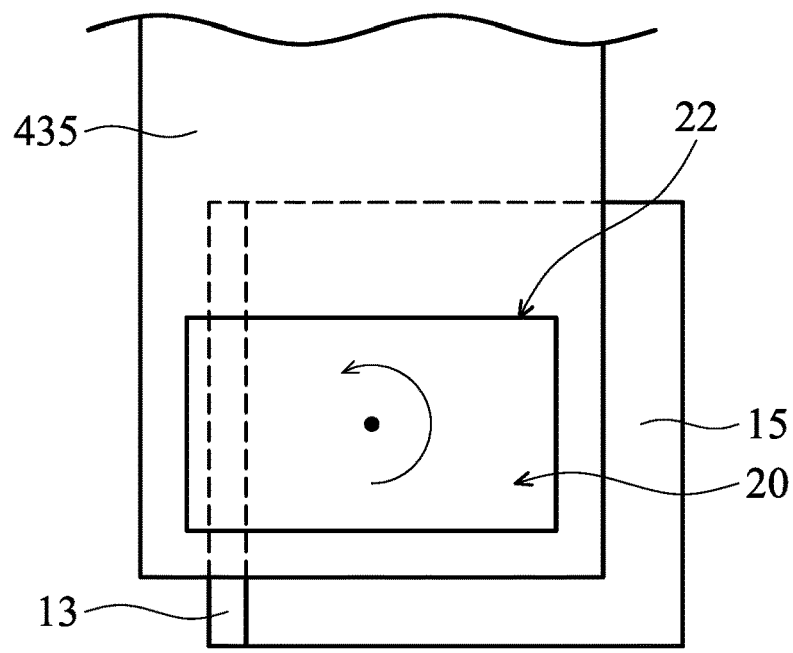
FIGS. 9A and 9B show top views of stages of a method for adjusting orientation of the cassette pod, in accordance with some embodiments.
Figure 9B:
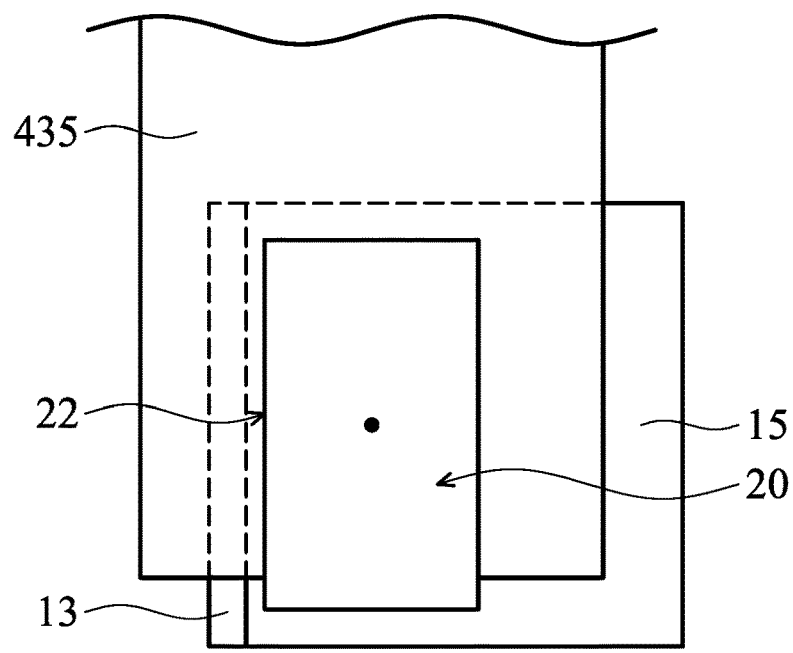

For example, as shown in FIG. 9A, the cassette pod 20 is placed on the stage 435 in such a manner that the orientation of the cassette pod 20 (i.e. the direction toward which the opening of the cassette pod 20 is oriented) is about 90 degrees different from the orientation of the tool access doors 13. To have the opening of the cassette pod 20 face the tool access doors 13, the cassette pod 20 is rotated by the rotary actuator 437 by about 90 degrees. After an adjustment in orientation, as shown in FIG. 9B, the opening 22 of the cassette pod 20 faces the tool access doors 13.

In some embodiments, the difference in the angle between the orientation of the opening 22 and orientation of the tool access doors 13 is a fixed value after the processing machine 10 is positioned in place of the FAB. Therefore, the adjustment in the orientation of the cassette pod 20 is performed according to the computer program. The computer program is preprogrammed to output a predetermined value of power to the rotary actuator 437 corresponding to the desire rotating angle.

It should be appreciated that many variations and modifications can be made to embodiments of the disclosure. In some embodiments, a number of sensors are utilized to measure the position or orientation of the cassette pod 20. The measured results are fed back to the controller. The controller analyzes the measurement signals and determines output power to the actuators to adjust the position and/or orientation of the cassette pod 20.

In some embodiments, as shown in FIG. 7, during the adjustment in the position and/or orientation of the cassette pod 20, the gripper assembly 35 of the OHT vehicle 33 is raised up to be transported by the rail 31. Afterwards, the conveyor module 45 is moved from the second axis a2 to the first axis a1. In the meantime, the door handling module 47 approaches the cassette pod 20.

The method 100 continues with operation 130, in which the door 23 of the cassette pod 20 is removed when the cassette pod 20 is placed on the stage 435. The operation 130 can be performed before or after operation 120. Stages of the method for removing the door 23 are described below.

Figure 10:
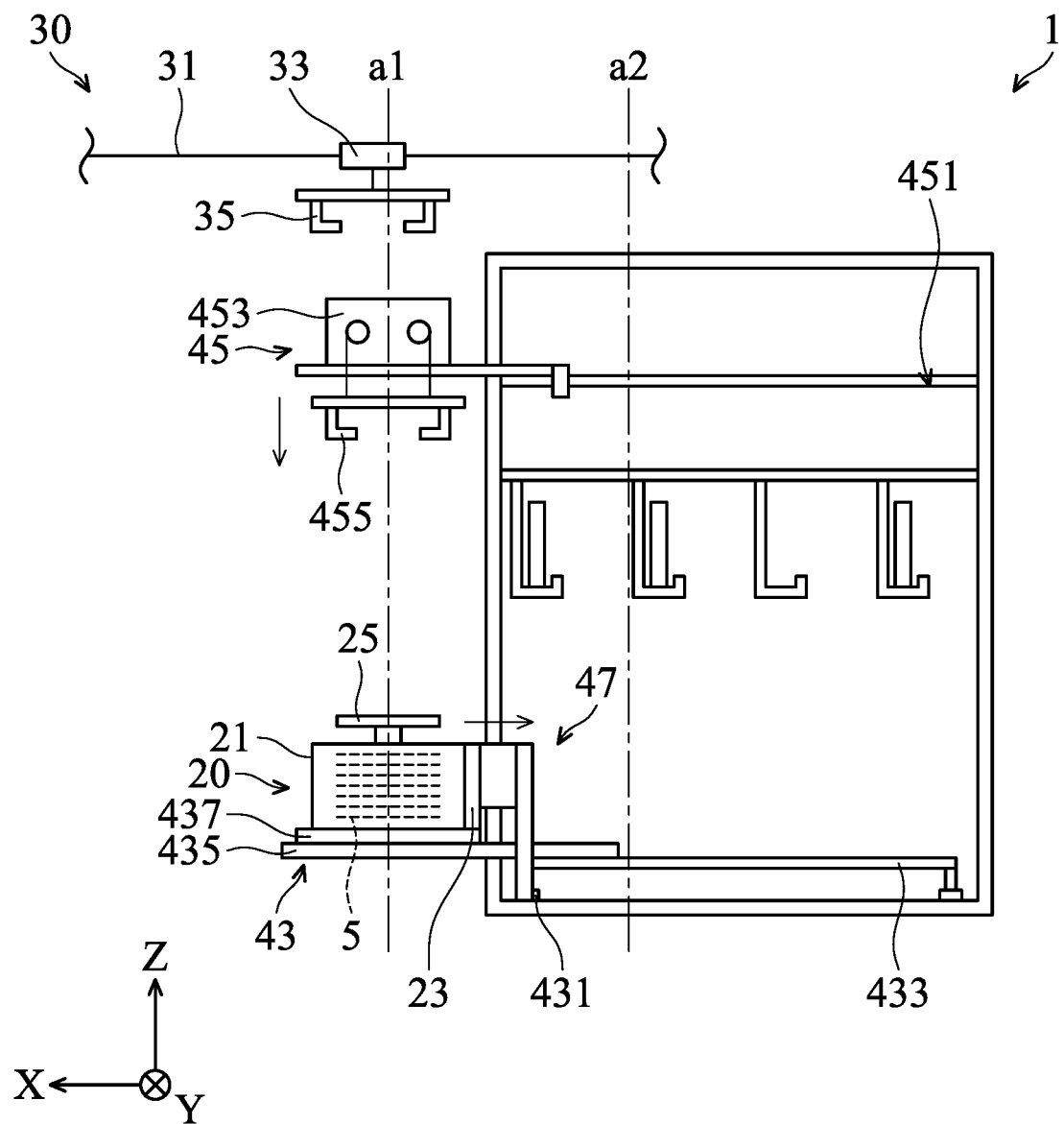
FIG. 10 shows a schematic view of one stage of the method for sending the cassette pod from the transportation system to the processing apparatus as a door of the cassette pod is removed by a door handling module, in accordance with some embodiments.
Figure 11:
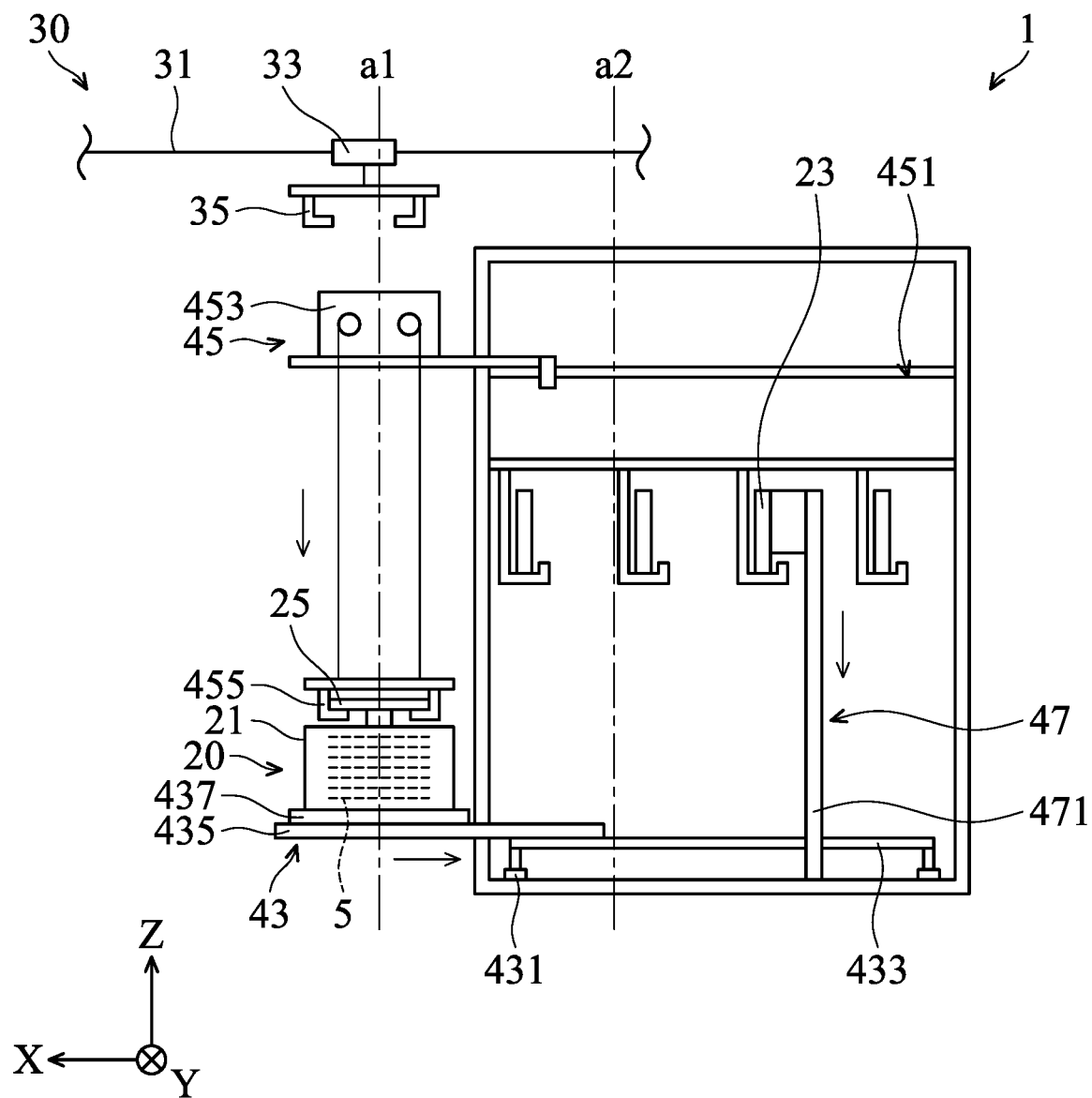
FIG. 11 shows a schematic view of one stage of the method for sending the cassette pod from the transportation system to the processing apparatus as the cassette pod is removed from the intermediate module by a conveyor module, in accordance with some embodiments.
Figure 12:
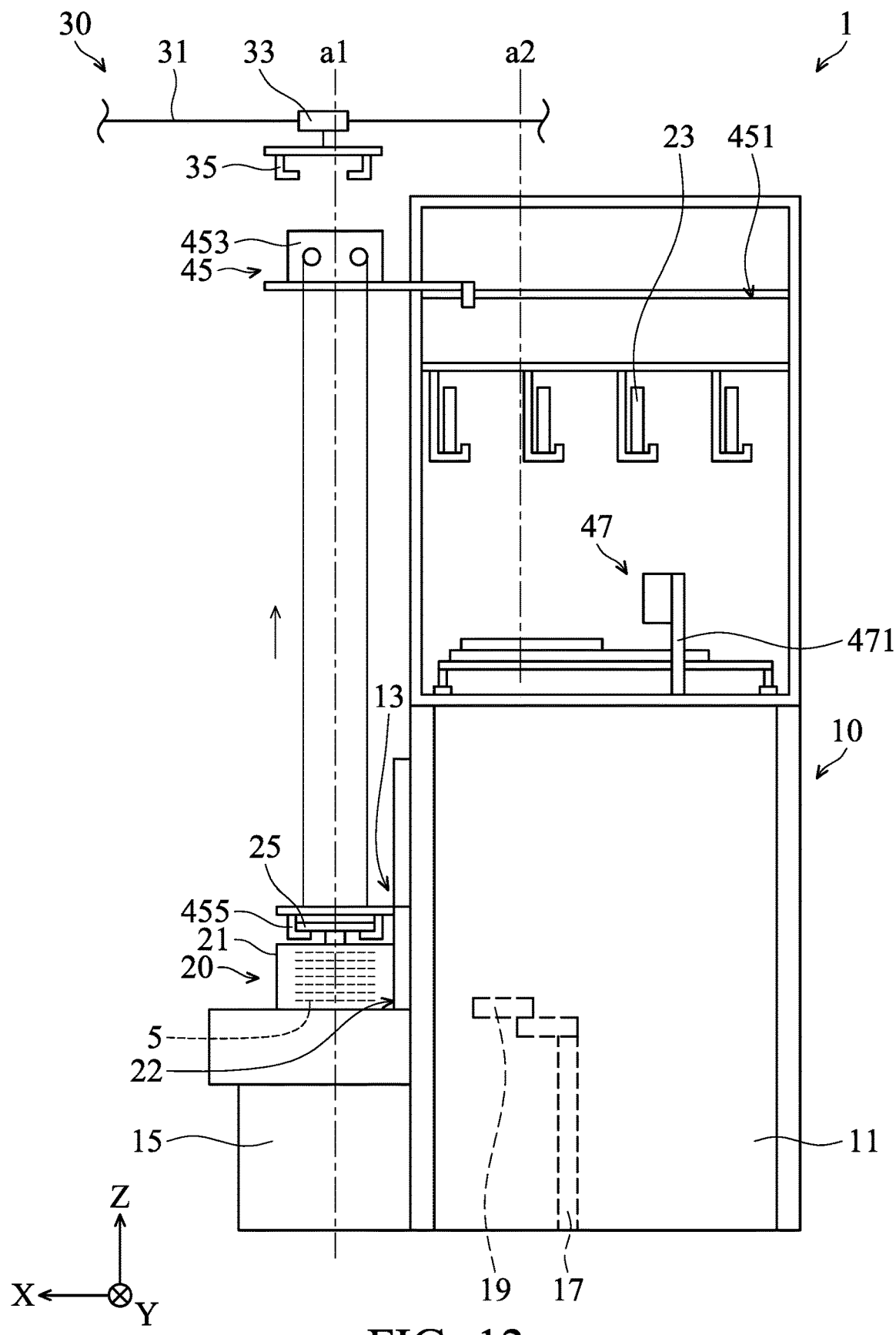
FIG. 12 shows a schematic view of one stage of the method for sending the cassette pod from the transportation system to the processing apparatus as the cassette pod is placed on a load port, in accordance with some embodiments.

Firstly, the door handling assembly 473 is moved toward the door 23 with the insertion members 477 (FIG. 4) aligning with the through holes 231 of the door 23. Afterwards, the insertion members 477 are inserted into the through holes 231 of the door 23. In the meantime, a vacuum is created between the door 23 and the suction member 475. Afterwards, as shown in FIG. 10, the door handling assembly 473 is moved away from the cassette pod 20 so as to remove the door 23 from the main body 21. The door 23 that is disengaged from the main body 21 may be then delivered by the door handling module 47 and stored in the storage racks 49, as shown in FIG. 11.

In cases where the position and/or orientation of the cassette pod 20 have been adjusted, the gripper assembly 455 may be lowered down by the hoisting mechanism 453, and the gripper assembly 455 grasps the cassette pod 20 while the door 23 is transporting by the door handling module 47.

The method 100 continues with operation 140, in which the cassette pod 20 is removed from the intermediate module 43 by the griping module 45. In some embodiments, as shown in FIG. 11 once the cassette pod 20 is grasped by the conveyor module 45 the intermediate module 43 is withdrawn from the first axis a1 to the second axis a2. In the meantime, the cassette pod 20 may be slightly moved away from the stage 435 by raising up the gripper assembly 455.

The method 100 continues with operation 150, in which the cassette pod 20 is placed on the load port 15 by the gripper assembly 455. In some embodiments, as shown in FIG. 11, the cassette pod 20 is placed on the load port 15 by lowering down the gripper assembly 455 and the cassette pod 20. When the cassette pod 20 is placed on the load port 15, the cassette pod 20 is released by the gripper assembly 455, and the empty gripper assembly 455 is retracted back to the hoisting mechanism 453.

It should be noted that since the position and/or orientation of the cassette pod 20 have been adjusted by the intermediate module 43 according to the position and/or orientation of the load port 15, the opening 22 of the main body 21 directly faces the tool access doors 13 of the processing tool 11. Therefore, the substrate 5 in the cassette pod 20 can be removed by the robotic arms 19 disposed in the processing tool 11 without damaging the substrate 5.

Figure 13:
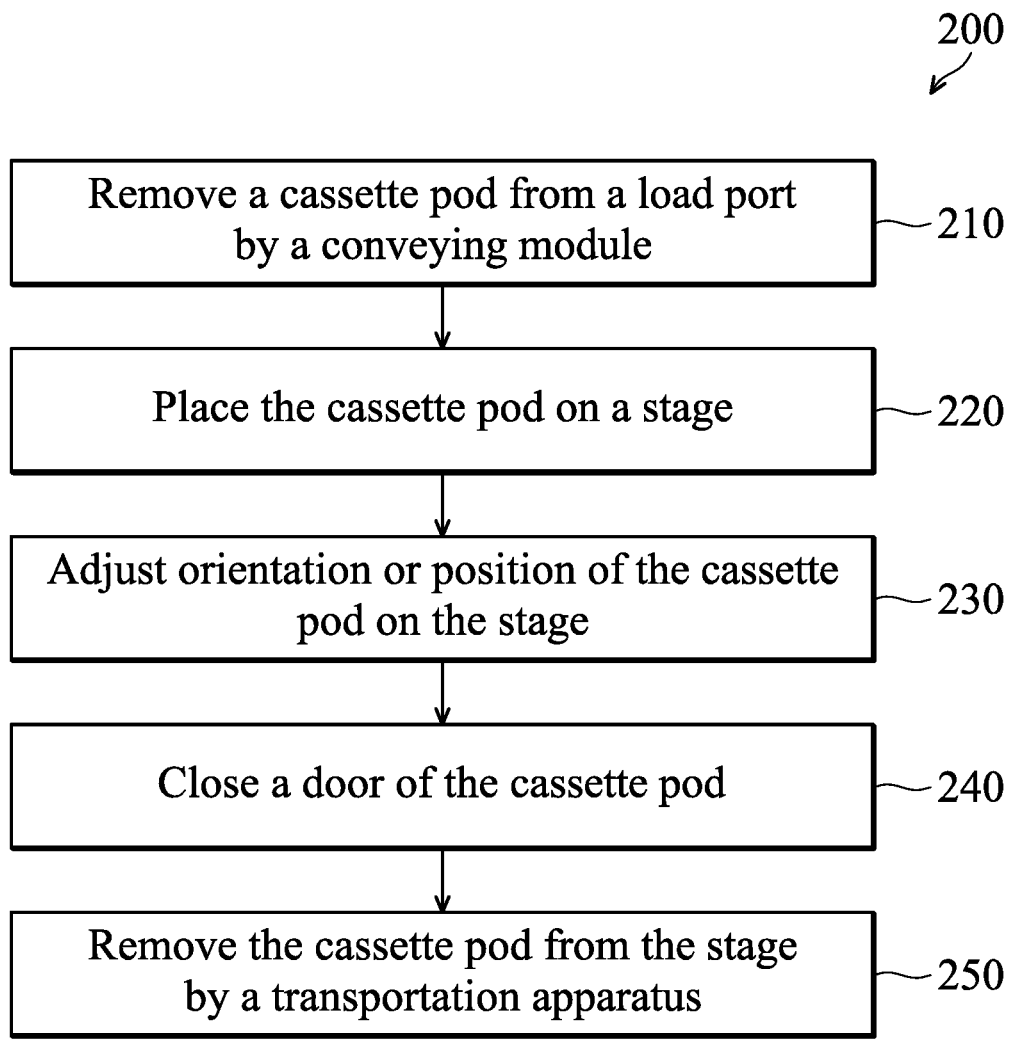
FIG. 13 shows a flow chart illustrating a method for sending a cassette pod from a processing apparatus to a transportation system, in accordance with some embodiments.

FIG. 13 is a flow chart illustrating a method 200 for sending the cassette pod 20 from the load port 15 to the transportation apparatus 30, in accordance with some embodiments. For illustration, the flow chart will be described to accompany the cross-sectional view shown in FIGS. 14-17. Some of the described stages can be replaced or eliminated in different embodiments. Additional features can be added to the semiconductor device structure. Some of the features described below can be replaced or eliminated in different embodiments.

Figure 14:
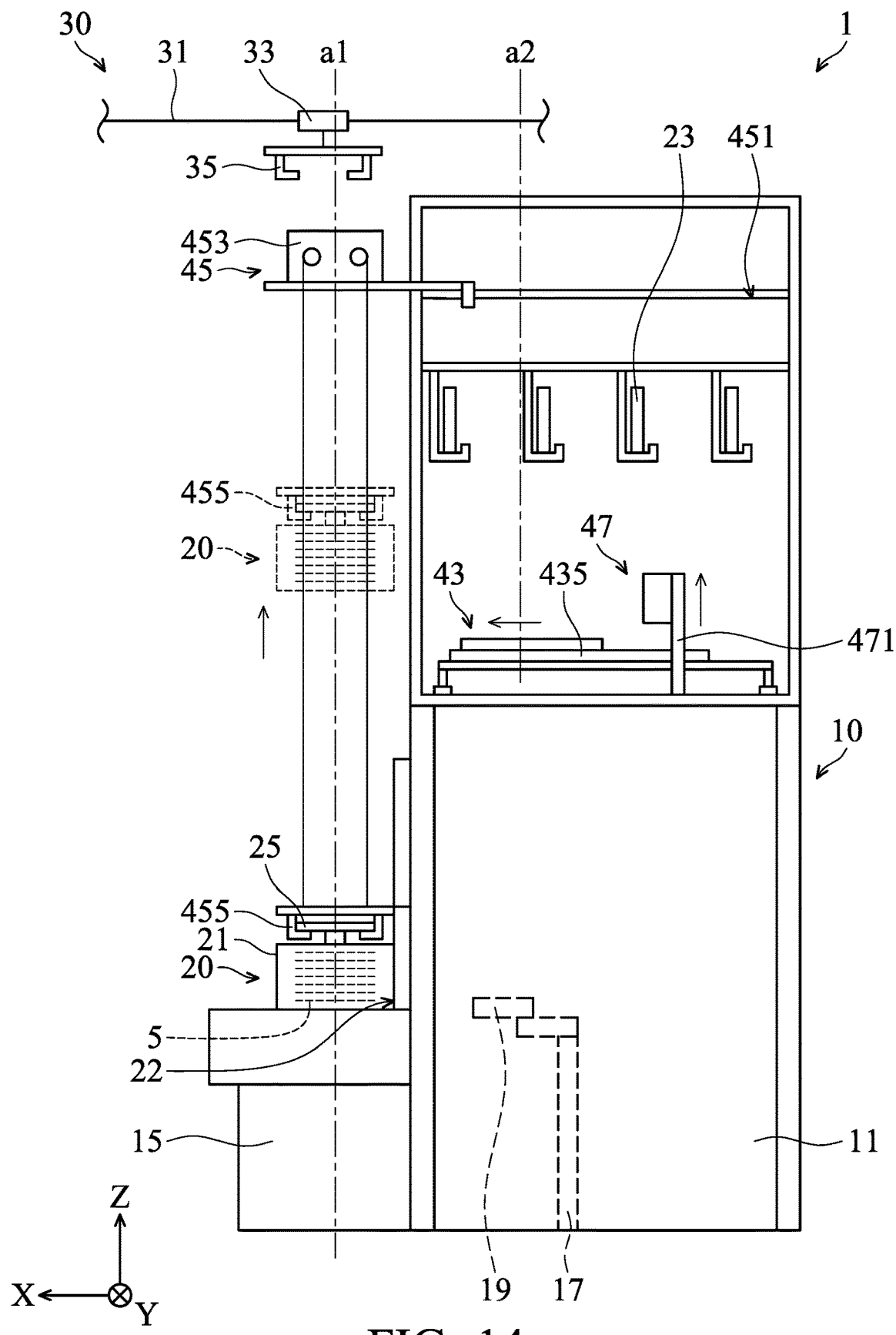
FIG. 14 shows a schematic view of one stage of the method for sending the cassette pod from the processing apparatus to the transportation system as the cassette pod is removed from a load port by a conveyor module, in accordance with some embodiments.

The method 200 begins with operation 210, in which the cassette pod 20 is removed from the load port 15 by the conveyor module 45. In some embodiments, as shown in FIG. 14, the cassette pod 20 containing the processed substrates 5 is grasped by the gripper assembly 455 of the conveyor module 45. The gripper assembly 455 is then retracted back to raise the cassette pod 20 to a predetermined position higher than the intermediate module 43, as shown in dotted lines in FIG. 14. Afterwards, the stage 435 is stretched out from the second axis a2 to the first axis a1.

Figure 15:
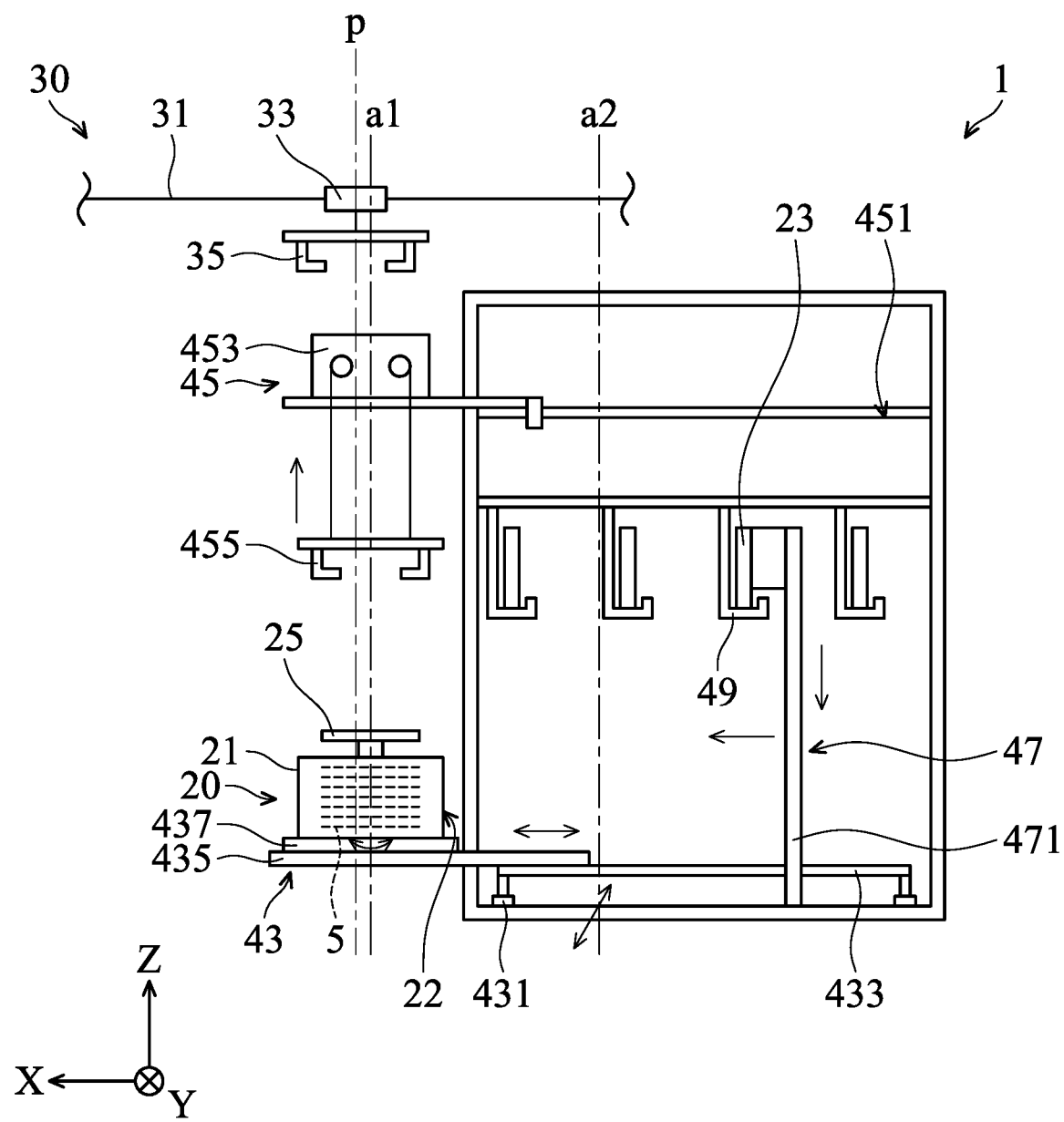
FIG. 15 shows a schematic view of one stage of the method for sending the cassette pod from the processing apparatus to the transportation system as the cassette pod is placed on an intermediate module and the position of the cassette pod is adjusted by the intermediate module, in accordance with some embodiments.

The method 200 continues with operation 220, in which the cassette pod 20 is placed on the stage 435. In some embodiments, after the stage 435 is aligned with the first axis a1, the cassette pod 20 is positioned on the stage 435 by the gripper assembly 455 by lowering down the gripper assembly 455. When the cassette pod 20 is placed on the stage 435, the cassette pod 20 is released by the gripper assembly 455, and the empty gripper assembly 455 is retracted back to the hoisting mechanism 453, as shown in FIG. 15.

The method 200 continues with operation 230, in which the orientation and/or position of the cassette pod 20 which is placed on the stage 435 of the intermediate module 43 are adjusted. In some embodiments, the stage 435 is moved a predetermined distance which is equal to the distance between the first axis a1 and the path P along which the gripper assembly 35 is moved. In some embodiments, the stage 435 is rotated at a predetermined rotation angle to make the opening 22 of the cassette pod 20 face the door handling module 47.

The method 200 continues with operation 240, in which the door 23 of the cassette pod 20 is closed. In some embodiments, as shown in FIG. 15, the door 23 is removed from the storage rack 49 and moved to the cassette pod 20 by the door handling module 47. The operation 240 can be performed before or after operation 230.

Figure 16:
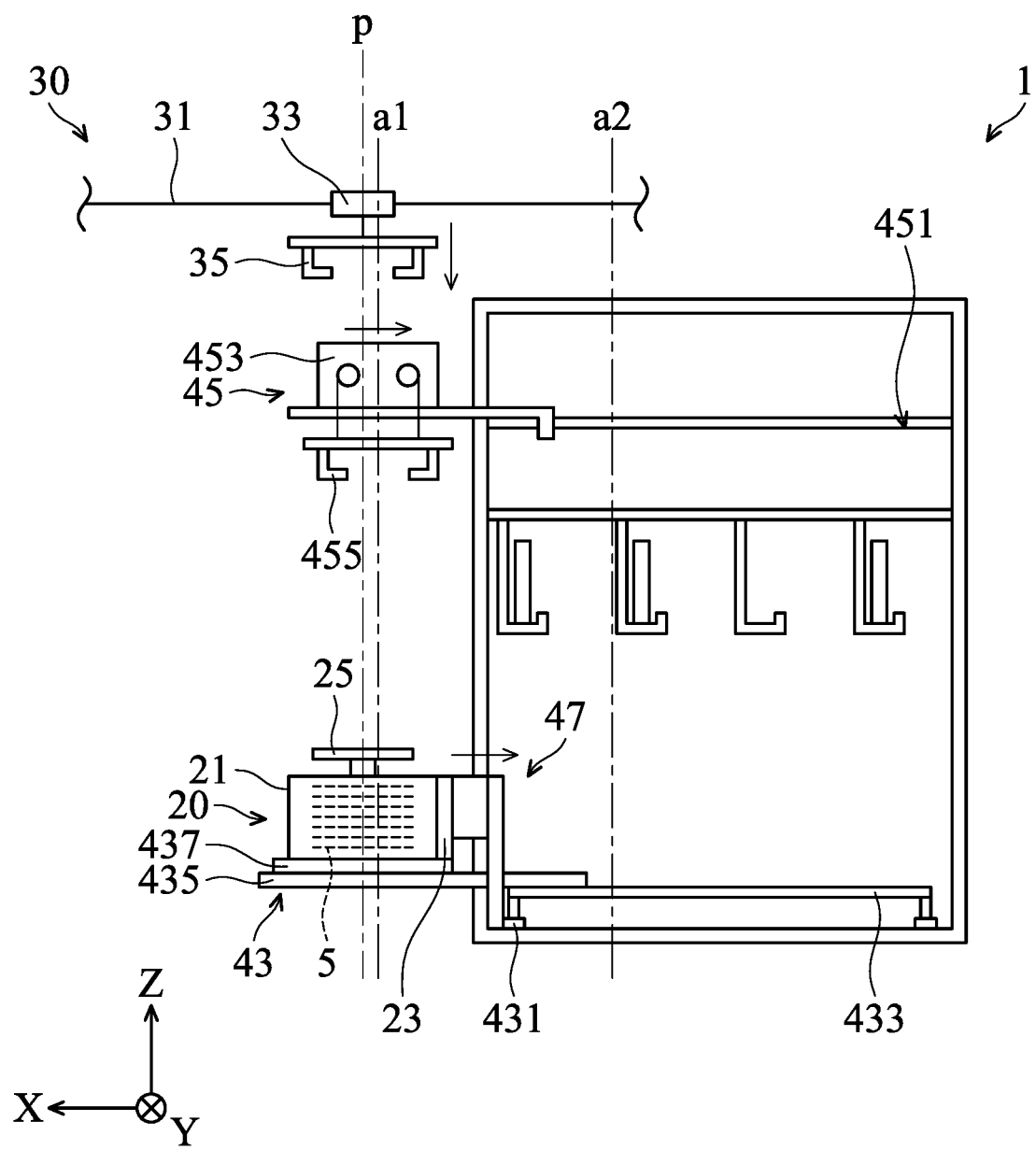
FIG. 16 shows a schematic view of one stage of the method for sending the cassette pod from the processing apparatus to the transportation system during the assembly of a door of the cassette pod by a door handling module.

In some embodiments, as shown in FIG. 16, after the door 23 is locked, the door handling module 47 is withdrawn into the housing 41. In the meantime, the conveyor module 45 is moved from the first axis a1 to the second axis a2 and stays inside the housing 41. Afterwards, the empty gripper assembly 35 is lowered down to the stage 435 to grip the cassette pod 20.

Figure 17:
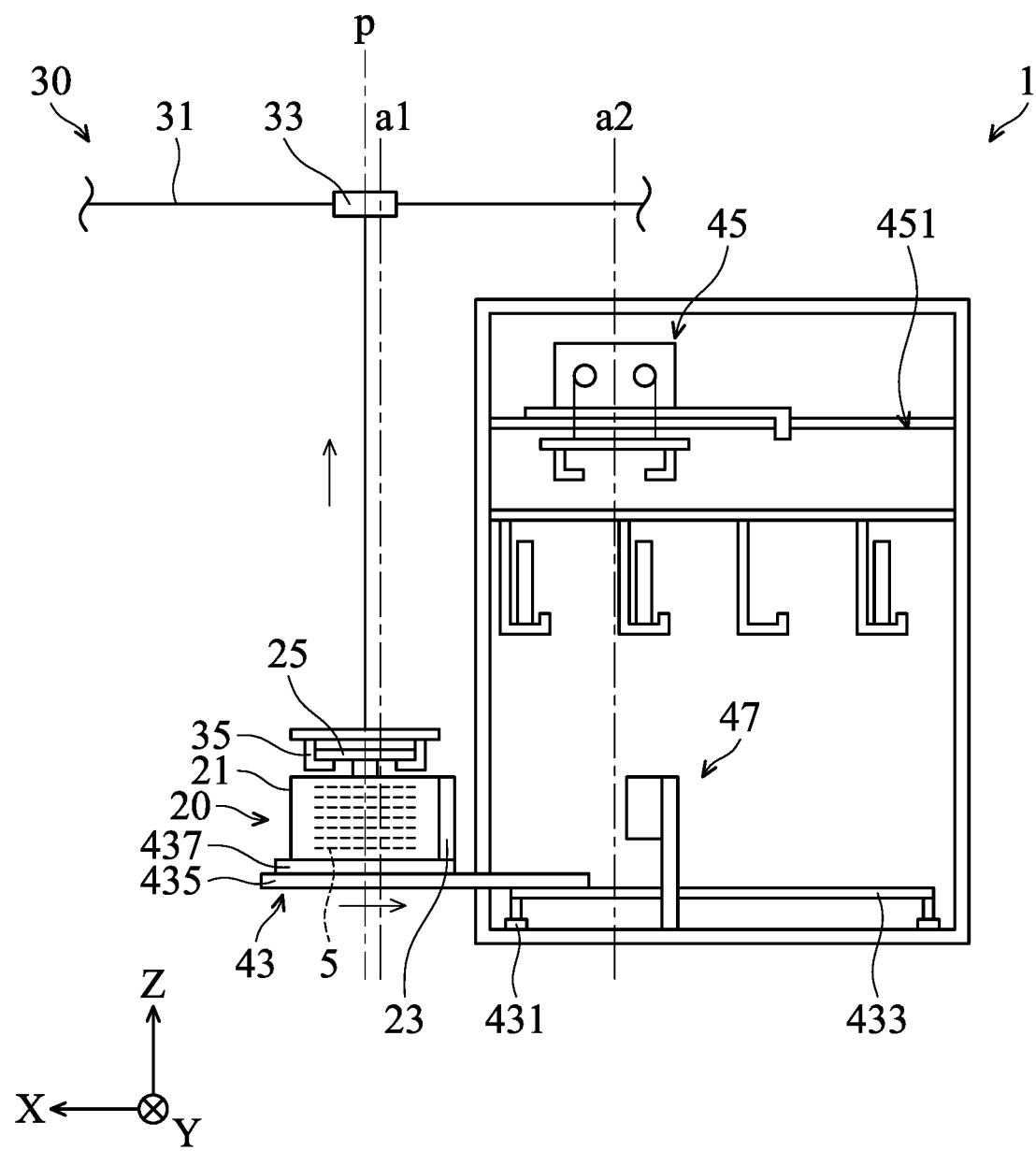
FIG. 17 shows a schematic view of one stage of the method for sending the cassette pod from the processing apparatus to the transportation system as the cassette pod is removed from the intermediate module by a transportation apparatus, in accordance with some embodiments.

The method 200 continues with operation 250, in which the cassette pod 20 is removed from the stage 435. In some embodiments, as shown in FIG. 17, the gripper assembly 35 is then retracted back into the OHT vehicle 33 to raise the cassette pod 20 for subsequent transport of the cassette pod 20 to another processing machine in the processing sequence or a stocker for storage.

Embodiments of sending a cassette pod between a processing machine and a transportation apparatus are provided. A manipulation apparatus is utilized for adjusting the orientation or position of the cassette pod before and after it is moved to and from a load port of the processing machine. Alignment of the cassette pod relative to the load port of the processing machine is assured, thereby preventing misfeeding or jamming of feed mechanisms which transfer substrates from the cassette pod to the processing machine. Also, the system obviates the need for manually removing the door of the cassette pod. The efficiency of the process is therefore improved, and contamination of the substrate is prevented.

According to some embodiments, a system for sending a cassette pod is provided. The system includes a processing machine having a load port for receiving the cassette pod. The system further includes a manipulating apparatus positioned above the processing machine. The manipulating apparatus includes an intermediate module positioned at a lower section of the manipulating apparatus. The intermediate module includes a stage and a driving mechanism connected to the stage to change the position of the stage. The manipulating apparatus further includes a conveyor module positioned at an upper section of the manipulating apparatus. The conveyor module includes a gripper assembly for grasping the cassette pod.

According to some embodiments, a method for sending a cassette pod is provided. The method includes placing the cassette pod on a stage by a transportation apparatus. The method further includes moving the stage when the cassette pod is placed on the stage so as to adjust the orientation or position of the cassette pod. The method also includes removing the cassette pod from the stage with a gripper assembly. In addition, the method includes placing the cassette pod on a load port of a processing machine.

According to some embodiments, a method for sending a cassette pod is provided. The method includes removing a cassette pod from a load port of a processing machine by a gripper assembly. The method further includes placing the cassette pod on a stage. The method also includes moving the stage when the cassette pod is placed on the stage so as to adjust the orientation or position of the cassette pod. In addition, the method includes removing the cassette pod from the stage using a transportation apparatus.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for sending a cassette pod, comprising:
placing the cassette pod on a stage by a transportation apparatus;
moving the stage when the cassette pod is placed on the stage so as to adjust orientation or position of the cassette pod;

removing a door of the cassette pod when the cassette pod is placed on the stage and moving the door to a storage rack above the stage for storing;

removing the cassette pod from the stage by a gripper assembly; and moving the gripper assembly with the cassette pod along a first axis that passes through a load port of a processing machine so as to place the cassette pod on the load port, wherein the stage and the gripper assembly are positioned on the processing machine, and the transportation apparatus comprising an overhead hoist transport (OHT) vehicle moveable along a rail that is located over the processing machine.

2. The method for sending the cassette pod as claimed in claim 1, wherein the movement of the stage comprises moving the stage in a longitudinal direction and a transversal direction which is perpendicular to the longitudinal direction.

3. The method for sending the cassette pod as claimed in claim 1, wherein the movement of the stage comprises rotating the stage about a rotation axis so as to face an opening of the cassette pod toward a tool access door of the processing machine.

4. The method for sending the cassette pod as claimed in claim 1, wherein there is a second axis that is parallel to the first axis and spaced from the first axis by a predetermined distance;

wherein after the cassette pod is placed on the stage, the transportation apparatus is removed, and the gripper assembly is moved from the second axis to the first axis to grasp the cassette pod;

wherein after the cassette pod is grasped by the gripper assembly, the stage is moved from the first axis to the second axis, and the gripper assembly places the cassette pod on the load port.

5. The method for sending the cassette pod as claimed in claim 1, wherein the removal of the door comprises:

creating a vacuum between the door and a dish-shape member of a door handling module; and inserting a pin of the door handling module into a through hole formed on the door.

6. The method for sending the cassette pod as claimed in claim 5, wherein the removal of the door further comprises moving the door handling module in a direction away from the cassette and perpendicular to a direction of moving the door to the storage rack.

7. The method for sending the cassette pod as claimed in claim 6, wherein the direction of moving the door to the storage rack is parallel to the first axis.

8. A method for sending a cassette pod, comprising:

placing the cassette pod on a load port of a processing machine;

holding the cassette pod by a gripper assembly and moving the gripper assembly with the cassette pod along a first axis that passes through the load port so as to remove the cassette pod from the load port of the processing machine;

placing the cassette pod on a stage using the gripper assembly;

moving a door downward from a storage rack above the stage and attaching the door to the cassette pod when the cassette pod is placed on the stage to close the cassette pod;

moving the stage when the cassette pod is placed on the stage so as to adjust the orientation or position of the cassette pod; and removing the cassette pod from the stage using a transportation apparatus, wherein the stage and the gripper assembly are positioned on the processing machine, and the transportation apparatus comprising an overhead hoist transport (OHT) vehicle moveable along a rail that is located over the processing machine.

9. The method for sending the cassette pod as claimed in claim 8, wherein the movement of the stage comprises moving the stage in a longitudinal direction and a transversal direction which is perpendicular to the longitudinal direction.

10. The method for sending the cassette pod as claimed in claim 8, wherein the movement of the stage comprises rotating the stage about a rotation axis so as to face an opening of the cassette pod toward a tool access door of the processing machine.

11. The method for sending the cassette pod as claimed in claim 8, wherein there is a second axis that is parallel to the first axis and spaced from the first axis by a predetermined distance;

wherein after the cassette pod is removed by the gripper assembly from the load port, the gripper assembly is moved along the first axis to a predetermined position higher than the stage;

wherein when the gripper assembly is at the predetermined position, the stage is moved from the second axis to the first axis, and the gripper assembly is lowered down to place the cassette pod.

12. The method for sending the cassette pod as claimed in claim 8, wherein the attachment of the door comprises:

creating a vacuum between the door and a dish-shape member of a door handling module; and inserting a pin of the door handling module into a through hole formed on the door.

13. The method for sending the cassette pod as claimed in claim 12, wherein the attachment of the door further comprises moving the door handling module in a direction toward the cassette and perpendicular to a direction of moving the door from the storage rack.

14. The method for sending the cassette pod as claimed in claim 13, wherein the direction of moving the door from the storage rack is parallel to the first axis.

15. A method for sending a cassette pod, comprising:

placing the cassette pod on a stage by a transportation apparatus to adjust the orientation or position of the cassette pod according to a point of a load port of a processing machine, and removing a door of the cassette pod when the cassette pod is placed on the stage and moving the door to a storage rack above the stage for storing, and moving the cassette pod from the stage to the load port by a gripper assembly with a center of the cassette pod aligning with the point of the load port; and moving the cassette pod from the load port to the stage by the gripper assembly to adjust the orientation or position of the cassette pod according to a path along which the transporting apparatus is moved, and moving the door downward from the storage rack and attaching the door to the cassette pod when the cassette pod is placed on the stage, and moving the cassette pod from the stage to the transportation apparatus with the center of the cassette pod aligning with the path, wherein the stage and the gripper assembly are positioned on a top of the processing machine, and the transportation apparatus comprising an overhead hoist transport (OHT) vehicle moveable along a rail that is located over the processing machine.

16. The method for sending the cassette pod as claimed in claim 15, wherein the stage is moved in a longitudinal direction and a transversal direction which is perpendicular to the longitudinal direction to adjust the position of the cassette pod.

17. The method for sending the cassette pod as claimed in claim 15, wherein the stage is rotated about a rotation axis to adjust the orientation of the cassette pod so as to face an opening of the cassette pod toward a tool access door of the processing machine.

18. The method for sending the cassette pod as claimed in claim 15, further comprising loading a substrate in the cassette pod into a processing tool and retracting the substrate back into the cassette pod after the substrate is processed in the processing tool when the cassette pod is placed on the load port which is configured for docking the cassette pod.

19. The method for sending the cassette pod as claimed in claim 15, wherein when the cassette pod is moved by the gripper assembly, the gripper assembly is located in a first axis that passes through the point on the load port, and the stage is located in a second axis that is parallel to the first axis and spaced from the first axis by a predetermined distance.

20. The method for sending the cassette pod as claimed in claim 15, wherein when the cassette pod is moved by the transportation apparatus, the stage assembly is located in a first axis that passes through the point on the load port, and the gripper assembly is located in a second axis that is parallel to the first axis and spaced from the first axis by a predetermined distance.

* * * * *